US012621999B2

(12) United States Patent
Cho et al.

(10) Patent No.: US 12,621,999 B2
(45) Date of Patent: May 5, 2026

(54) VARIABLE RESISTANCE MEMORY DEVICE

(71) Applicant: Samsung Electronics Co., Ltd., Suwon-si (KR)

(72) Inventors: Youngjin Cho, Suwon-si (KR); Seyun Kim, Seoul (KR); Yumin Kim, Seoul (KR); Doyoon Kim, Hwaseong-si (KR); Jinhong Kim, Seoul (KR); Soichiro Mizusaki, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 982 days.

(21) Appl. No.: 17/523,381

(22) Filed: Nov. 10, 2021

(65) Prior Publication Data

US 2022/0246679 A1    Aug. 4, 2022

(30) Foreign Application Priority Data

Jan. 29, 2021    (KR) ........................ 10-2021-0013469

(51) Int. Cl.
H10B 63/00        (2023.01)
H10N 70/00        (2023.01)
H10N 70/20        (2023.01)

(52) U.S. Cl.
CPC ........... H10B 63/845 (2023.02); H10B 63/34 (2023.02); H10N 70/24 (2023.02); H10N 70/8833 (2023.02)

(58) Field of Classification Search
CPC ... H10N 70/881–8845; H10N 70/8265; G11C 2213/11–19; G11C 2213/30–35; H10B 63/845
See application file for complete search history.

(56) References Cited

U.S. PATENT DOCUMENTS 8,427,865 B2    4/2013  Shima et al.
8,785,899 B2 *  7/2014  Ju ........................ H10N 70/841
                                                        257/4
(Continued)

FOREIGN PATENT DOCUMENTS

JP        2008-160004 A        7/2008
JP        2013-065779 A        4/2013
(Continued)

OTHER PUBLICATIONS

M Munde, et al. "Diffusion and Aggregation of Oxygen Vacancies in Amorphous Silica." Journal of Physics: Condensed Matter, vol. 29, No. 24, May 15, 2017, pp. 245701-245701, https://doi.org/10.1088/1361-648x/aa6f9a. Accessed Aug. 13, 2023. (Year: 2017).*
(Continued)

*Primary Examiner* — Chad M Dicke
*Assistant Examiner* — Mario Andres Autore, Jr.
(74) *Attorney, Agent, or Firm* — HARNESS, DICKEY & PIERCE, P.L.C.

(57) ABSTRACT

A variable resistance memory device includes a support layer including an insulating material; a variable resistance layer on the support layer and including a variable resistance material; a capping layer between the support layer and the variable resistance layer and protecting the variable resistance layer; a channel layer on the variable resistance layer; a gate insulating layer on the channel layer; and a plurality of gate electrodes and a plurality of insulators alternately and repeatedly arranged on the gate insulating layer in a first direction parallel with the channel layer. The capping layer may maintain oxygen vacancies formed in the variable resistance layer.

23 Claims, 15 Drawing Sheets

(56) References Cited

U.S. PATENT DOCUMENTS

| | | | | |
|---|---|---|---|---|
| 9,093,369 | B2 | 7/2015 | Shin et al. | |
| 9,159,768 | B2 | 10/2015 | Joo et al. | |
| 9,293,508 | B2 * | 3/2016 | Sasago | H10B 63/84 |
| 9,450,023 | B1 * | 9/2016 | Konevecki | H10N 70/8265 |
| 9,947,685 | B2 | 4/2018 | Fujii et al. | |
| 9,947,686 | B2 | 4/2018 | Son et al. | |
| 10,454,028 | B2 * | 10/2019 | Park | H10N 70/8836 |
| 10,700,129 | B2 * | 6/2020 | Ando | H10N 70/8416 |
| 10,896,728 | B2 * | 1/2021 | Kanamori | H10N 70/8836 |
| 11,682,717 | B2 * | 6/2023 | Kim | H10D 48/366 |
| | | | | 257/5 |
| 2005/0245039 | A1 * | 11/2005 | Li | H10N 70/826 |
| | | | | 438/384 |
| 2008/0149913 | A1 * | 6/2008 | Tanaka | H10B 63/34 |
| | | | | 438/238 |
| 2010/0230655 | A1 * | 9/2010 | Noshiro | H10N 70/20 |
| | | | | 257/E45.001 |
| 2012/0153249 | A1 * | 6/2012 | Zhang | H10N 70/021 |
| | | | | 257/E47.001 |
| 2013/0149815 | A1 * | 6/2013 | Murase | H10N 70/011 |
| | | | | 438/104 |
| 2013/0292630 | A1 | 11/2013 | Sasago et al. | |
| 2013/0328005 | A1 * | 12/2013 | Shin | H10B 63/34 |
| | | | | 257/1 |
| 2014/0027702 | A1 | 1/2014 | Lu et al. | |
| 2014/0054531 | A1 | 2/2014 | Lu et al. | |
| 2014/0117304 | A1 * | 5/2014 | Park | H10B 63/34 |
| | | | | 257/4 |
| 2014/0268995 | A1 * | 9/2014 | Joo | H10N 70/063 |
| | | | | 257/4 |
| 2016/0181273 | A1 * | 6/2016 | Kim | H10D 64/037 |
| | | | | 438/269 |
| 2017/0141305 | A1 | 5/2017 | Yang et al. | |
| 2020/0083292 | A1 * | 3/2020 | Yamaguchi | H01L 23/528 |
| 2020/0161328 | A1 | 5/2020 | Yoon et al. | |
| 2020/0403035 | A1 * | 12/2020 | Ogiwara | H10B 63/84 |
| 2021/0035641 | A1 | 2/2021 | Yoon et al. | |
| 2021/0202833 | A1 * | 7/2021 | Kim | H10B 63/84 |
| 2021/0202840 | A1 | 7/2021 | Kim et al. | |
| 2021/0217473 | A1 | 7/2021 | Cho et al. | |
| 2022/0020818 | A1 | 1/2022 | Kim et al. | |

FOREIGN PATENT DOCUMENTS

| | | | |
|---|---|---|---|
| JP | 2017-092471 | A | 5/2017 |
| JP | 2021-002629 | A | 1/2021 |
| KR | 2009/0054236 | A | 5/2009 |
| KR | 2022/0011005 | A | 1/2022 |

OTHER PUBLICATIONS

M Munde, et al. "Diffusion and Aggregation of Oxygen Vacancies in Amorphous Silica." Journal of Physics: Condensed Matter, vol. 29, No. 24, May 15, 2017, pp. 245701-245701, https://doi.org/10.1088/1361-648x/aa6f9a. Accessed Aug. 13, 2023.—Teaches oxygen vacancies for silicon oxide. (Year: 2017).*

Appendix A: The Thermodynamics of Oxygen in Silicon.*

Gang Jian-Lei, et al. "Clockwise vs Counter-Clockwise I-V Hysteresis of Point-Contact Metal-Tip/Pr 0.7 ca 0.3 MnO 3 /Pt Devices." Chinese Physics Letters, vol. 27, No. 2, Feb. 1, 2010, pp. 027301-027301, https://doi.org/10.1088/0256-307x/27/2/027301. Accessed Aug. 15, 2024. (Year: 2010).*

Spencer, P. J. (1981). Thermochemical Properties. Atomic Energy Review, Special Issue No. 8, p. 9-53. (Year: 1981).*

Che, Xiangli, et al. "Heat Capacity and Thermodynamic Functions of Brookite TiO 2." The Journal of Chemical Thermodynamics, vol. 93, Feb. 1, 2016, pp. 45-51, https://doi.org/10.1016/j.jct.2015.09.018. Accessed Jul. 30, 2024. (Year: 2016).*

Extended European Search Report dated Jun. 28, 2022, issued in corresponding European Patent Application No. 21214376.2.

Japanese Office Action dated Nov. 18, 2025 for corresponding Japanese Patent Application No. 2022-10127 and its English-language translation.

* cited by examiner

1

VARIABLE RESISTANCE MEMORY DEVICE

CROSS-REFERENCE TO RELATED APPLICATION

This application is based on and claims priority under 35 U.S.C. § 119 to Korean Patent Application No. 10-2021-0013469, filed on Jan. 29, 2021 in the Korean Intellectual Property Office, the disclosure of which is incorporated by reference herein in its entirety.

BACKGROUND

1. Field

The present disclosure relates to a nonvolatile memory device using a variable resistance material.

2. Description of Related Art

A nonvolatile memory device as a semiconductor memory device may not lose stored data even if the supply of power thereto is stopped. The nonvolatile memory device may include, for example, programmable read-only memory (PROM), erasable PROM (EPROM), electrically EPROM (EEPROM), a flash memory device, etc.

Recently, in accordance with the trend of requirements for technologies having the characteristics of high integration, low power consumption, and random memory-cell access capability, next-generation semiconductor memory devices, such as magnetic random-access memory (MRAM) and phase-change random-access memory (PRAM), have been developed.

These next-generation semiconductor memory devices may be implemented as resistance change devices, which have resistance values that change according to an applied current or voltage and which maintain the changed resistance values even if a current or voltage supply is stopped. In order to realize high integration and low power consumption, it may be desirable that the resistance change characteristics of a resistance change device occur at a low applied voltage. A wide range of resistance change may be desired.

SUMMARY

Provided is a variable resistance memory device having the improved variable resistance performance.

Additional aspects will be set forth in part in the description that follows and, in part, will be apparent from the description, or may be learned by practice of the presented embodiments of the disclosure.

According to an embodiment, a variable resistance memory device may include a support layer including an insulating material; a variable resistance layer on the support layer and including a variable resistance material; a capping layer between the support layer and the variable resistance layer and being configured to protect the variable resistance layer; a channel layer on the variable resistance layer; a gate insulating layer on the channel layer; and a plurality of gate electrodes and a plurality of insulators alternately and repeatedly arranged on the gate insulating layer in a first direction that is parallel with the channel layer.

In some embodiments, the capping layer may include a material configured to maintain an amount of oxygen vacancies formed in the variable resistance layer.

In some embodiments, the capping layer may include an oxide that has an oxide formation energy having a greater absolute value than an absolute value of an oxide formation energy of the variable resistance material.

In some embodiments, the variable resistance layer may have a structure including a plurality of layers, and the capping layer may include an oxide that has an oxide formation energy having a greater absolute value than an absolute value of an oxide formation energy of a layer of the plurality of layers. The layer may contact the capping layer.

In some embodiments, a thickness of the variable resistance layer may be equal to or less than about 100 nm.

In some embodiments, a thickness of the capping layer may be equal to or less than about 100 nm.

In some embodiments, a thickness of the capping layer may be equal to or greater than about 2 nm.

In some embodiments, the variable resistance material may be $Ta_2O_5$, and the capping layer may include any one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the variable resistance material may be $TiO_2$, and the capping layer may include any one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the variable resistance material may be $HfO_2$, and the capping layer may include any one of $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the variable resistance material may be $ZrO_2$, and the capping layer may include any one of $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the channel layer may include a polycrystalline silicon (poly-Si) material.

In some embodiments, the variable resistance layer may include a silicon oxide layer contacting the channel layer. The variable resistance material may be on the silicon oxide layer.

In some embodiments, the support layer and the capping layer may include a same material.

In some embodiments, the support layer may have a cylindrical shape extending in the first direction. The variable resistance layer, the channel layer, and the gate insulating layer may surround the support layer in a cylindrical shell form, sequentially in an order of the variable resistance layer, the channel layer, and the gate insulating layer. The plurality of gate electrodes and the plurality of insulators may alternately surround the gate insulating layer.

In some embodiments, the capping layer may include an oxide that has an oxide formation energy having a greater absolute value than an absolute value of an oxide formation energy of the variable resistance material.

In some embodiments, the variable resistance layer may have a structure including a plurality of layers, and the capping layer may include an oxide that has an oxide formation energy having a greater absolute value than an absolute value of an oxide formation energy of a layer of the plurality of layers. The layer may contact the capping layer.

In some embodiments, the support layer and the capping layer may include a same material.

In some embodiments, the variable resistance memory device may further include a drain structure and a source structure respectively contacting both ends of the channel layer and the variable resistance layer in the first direction; a bit line connected to the drain structure; a source line connected to the source structure; and a plurality of word lines respectively connected to the plurality of gate electrodes.

In some embodiments, the variable resistance layer may directly contact the capping layer.

In some embodiments, the variable resistance material may be $HfO_2$ and the capping layer may include $Al_2O_3$.

In some embodiments, the variable resistance material may be $Ta_2O_5$ and the capping layer may include $Al_2O_3$.

In some embodiments, the variable resistance material may be $Ta_2O_5$ and the capping layer may include $HfO_2$.

According to another embodiment, an electronic device may include the variable resistance memory device.

According to an embodiment, a variable resistance memory device may include a capping layer including a metal oxide; a variable resistance layer on the capping layer, the variable resistance layer including a variable resistance material including oxygen vacancies, an absolute value of an oxide formation energy of the variable resistance material being less than an absolute value of an oxide formation energy of the metal oxide; a plurality of gate electrodes and a plurality of insulators alternately and repeatedly arranged on the variable resistance layer, the variable resistance layer extending between the capping layer and the plurality of gate electrodes; a gate insulating layer on the variable resistance layer; and a channel layer between the gate insulating layer and the variable resistance layer.

In some embodiments, the variable resistance layer may directly contact the capping layer.

In some embodiments, the variable resistance material may be $HfO_2$ and the capping layer may include $Al_2O_3$.

In some embodiments, the variable resistance material may be $Ta_2O_5$ and the capping layer may include $Al_2O_3$.

In some embodiments, the variable resistance material may be $Ta_2O_5$ and the capping layer may include $HfO_2$.

In some embodiments, the variable resistance material may be $Ta_2O_5$, and the metal oxide in the capping layer may include at least one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the variable resistance material may be $TiO_2$, and the metal oxide in the capping layer may include at least one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the variable resistance material may be $HfO_2$, and the metal oxide in the capping layer may include at least one of $Al_2O_3$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the variable resistance material may be $ZrO_2$, and the metal oxide in the capping layer may include at least one of $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

In some embodiments, the channel layer may include a polycrystalline silicon (poly-Si) material. The variable resistance layer may further include a silicon oxide layer contacting the channel layer. The variable resistance layer may further include a film including the variable resistance material.

In some embodiments, a memory system may include processing circuitry coupled to the variable resistance memory device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
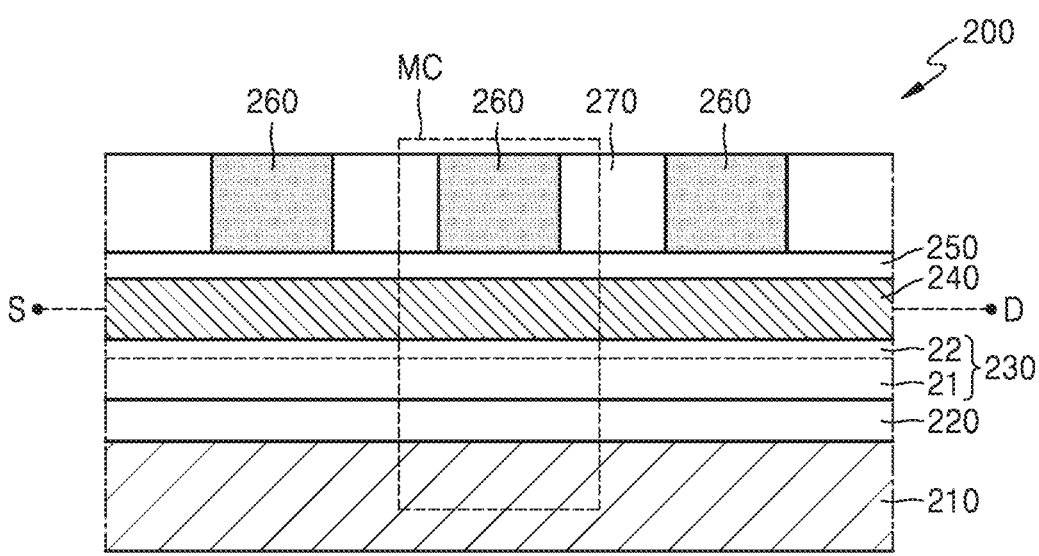
FIG. 1 is a schematic cross-sectional view of a variable resistance memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described in detail by referring to the accompanying drawings. The embodiments described hereinafter are only examples, and various modifications may be made based on the embodiments. In the drawings, the same reference numerals denote the same elements and sizes of elements may be exaggerated for clarity and convenience of explanation.

Hereinafter, it will be understood that when an element is referred to as being "on" another element, the element can be directly over or under the other element and directly on the left or on the right of the other element, or intervening elements may also be present therebetween. When an element is referred to as being "over" another element, the element can be directly over the other element or intervening elements may also be present therebetween.

Although the terms first, second, etc. may be used herein to describe various elements, these terms are only used to distinguish one element from another. These terms are not used to define differences of materials or structures between the elements.

As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

Also, the terms such as " . . . unit," "module," or the like used in the specification indicate an unit, which processes at least one function or motion, and the unit may be implemented by hardware or software, or by a combination of hardware and software.

The term "the" and other equivalent determiners may correspond to a singular referent or a plural referent.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are defined in the scope of the claims.

Figure 2:
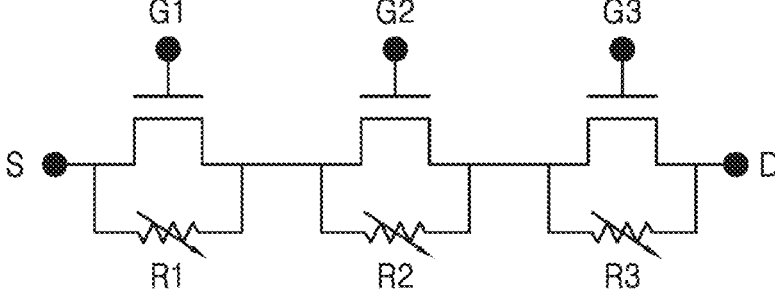
FIG. 2 illustrates an equivalent circuit with respect to the variable resistance memory device of FIG. 1.
Figure 3:
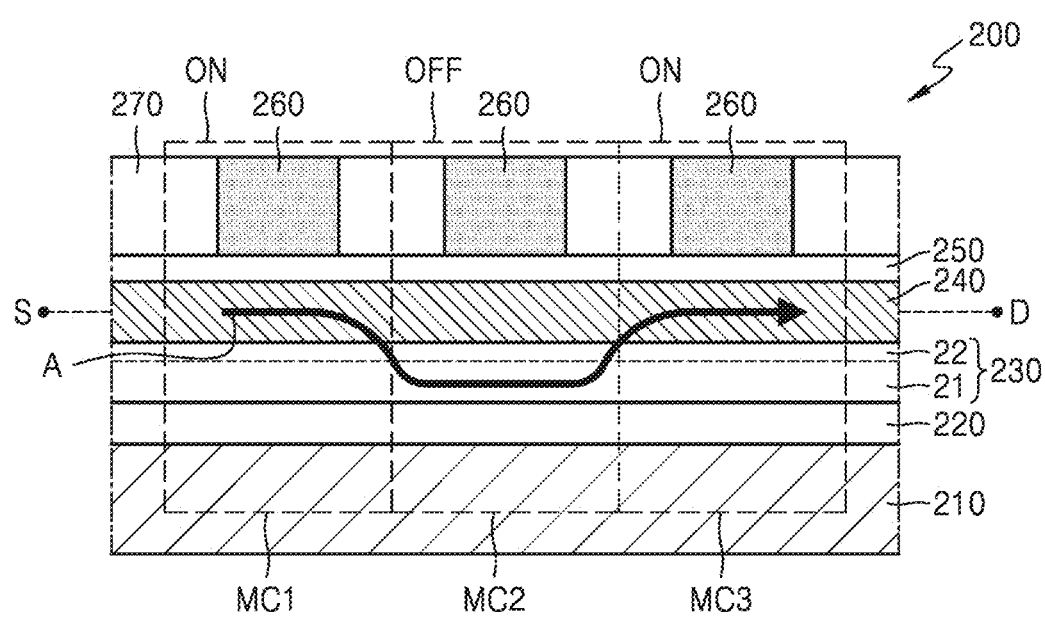
FIG. 3 is a conceptual diagram for describing an example operation of the variable resistance memory device of FIG. 1.

FIG. 1 is a cross-sectional view showing a schematic structure of a variable resistance memory device 200 according to an embodiment, and FIG. 2 illustrates an equivalent circuit with respect to the variable resistance memory device 200 of FIG. 1. FIG. 3 is a conceptual diagram for describing an example operation of the variable resistance memory device 200 of FIG. 1.

Referring to FIG. 1, the variable resistance memory device 200 may include a support layer 210 including an insulating material, a variable resistance layer 230 arranged on the support layer 210 and including a variable resistance material, a capping layer 220 arranged between the support layer 210 and the variable resistance layer 230 and protecting the variable resistance layer 230, a channel layer 240 arranged on the variable resistance layer 230 a gate insulting layer 250 arranged on the channel layer 240, and a plurality of gate electrodes 260 formed on the gate insulating layer 250. An insulator 270 for insulating adjacent gate electrodes 260 of the plurality of gate electrodes 260 may be provided between the adjacent gate electrodes 260. However, it is only an example, and the insulator 270 may be omitted. The variable resistance layer 230 may be directly on the capping layer 220.

The variable resistance layer 230 may be a layer having a characteristic of different resistance values depending on applied voltages. An oxygen mobility occurring, according to an electric field formed in the variable resistance layer 230, in a variable resistance material included in the variable resistance layer, may form a conductive filament, which may cause a change in the resistance of the variable resistance layer 230. According to whether or not the conductive filament is formed, the variable resistance layer 230 may indicate a low resistive state or a high resistive state, so as to write data of "1" or "0" for example. However, inventive concepts are not limited thereto. In some embodiments, depending on the voltage applied to the variable resistance layer 230, the resistance in the variable resistance layer 230 may be adjusted (e.g., increase or decrease) to different resistance values so as to support writing data for multi-level program states.

The variable resistance material included in the variable resistance layer 230 may include a metal oxide including oxygen vacancies. The metal oxide may include, for example, $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, or $MnO_2$. Gathered oxygen vacancies may form the conductive filament. When the conductive filament forms, the resistance of the variable resistance layer 230 may decrease. An applied voltage that changes the variable resistance layer 230 from a high resistive state to a low resistive state may be referred to as a set voltage Vset, and an applied voltage that changes the variable resistance layer 230 from a low resistive state to a high resistive state may be referred to as a reset voltage Vreset. The variable resistance memory device 200 according to an embodiment may include a capping layer 220 between the variable resistance layer 230 and the support layer 210, wherein the capping layer 220 includes a material that effectively maintains the oxygen vacancies formed in the variable resistance layer 230 in order to realize a low set voltage and increase a resistance difference between the high resistive state and the low resistive state.

The capping layer 220 may include a metal oxide and may include, for example, any one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$. The capping layer 220 may include a material for maintaining or increasing the oxygen vacancies of the variable resistance layer 230, in other words, for limiting and/or preventing a reduction of the oxygen vacancies of the variable resistance layer 230. To this end, the capping layer 220 may include a material having a higher oxygen binding stability than the variable resistance material included in the variable resistance layer 230. The oxygen binding stability may be indicated by an oxide formation energy. The oxide formation energy is indicated as a negative value. When the absolute value thereof is increased, that is, the oxide formation energy is decreased, the oxygen binding stability is increased. As the oxygen binding stability of the material included in the capping layer 220 is increased, it may become more difficult for oxygen of the capping layer 220 to move to the variable resistance layer 230, and thus the oxygen vacancies of the variable resistance layer 230 do not decrease. The capping layer 220 may include a material having a lower oxide formation energy, that is, an oxide formation energy of a larger absolute value, than the variable resistance material of the variable resistance layer 230.

The variable resistance performance may be increased, as a difference between the absolute value of the oxide formation energy of the capping layer 220 and the absolute value of the oxide formation energy of the variable resistance layer 230 is increased. The difference between the absolute value of the oxide formation energy of the capping layer 220 and the absolute value of the oxide formation energy of the variable resistance layer 230 may be configured such that a ratio of the difference to the absolute value of the oxide formation energy of the variable resistance layer 230 is equal to or greater than about 5% and/or the ratio may be equal to or greater than about 10%.

When the variable resistance material included in the variable resistance layer 230 is $Ta_2O_5$, the capping layer 220 may include any one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

When the variable resistance material included in the variable resistance layer 230 is $TiO_2$, the capping layer 220 may include any one of $HfO_2$, $Al_2O_3$, $ZrO_2$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

When the variable resistance material included in the variable resistance layer 230 is $HfO_2$, the capping layer 220 may include any one of $Al_2O_3$, $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

When the variable resistance material included in the variable resistance layer 230 is $ZrO_2$, the capping layer 220 may include any one of $MgO$, $CaO$, $SrO$, $BaO$, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

The variable resistance layer 230 may have a structure including a plurality of layers. For example, as illustrated in FIG. 1, the variable resistance layer 230 may include two layers including different materials from each other, namely, a first layer 21 and a second layer 22. In this case, the material of the capping layer 220 may have an oxide formation energy having a greater absolute value than an absolute value of an oxide formation energy of a variable resistance material of the first layer 21 contacting the capping layer 220. The variable resistance layer 230 may include a single layer, three layers, or more than three layers.

The thickness of each of the variable resistance layer 230 and the capping layer 220 may be about equal to or less than about 100 nm (e.g., about 1 nm to about 100 nm) or equal to or less than about 10 nm (e.g., about 1 nm to about 10 nm). The thickness of the capping layer 220 may be greater than about 1 nm or equal to, greater than about 2 nm or equal to, or greater than about 5 nm (e.g., in a range of about 2 nm to about 50 nm and/or about 5 nm to about 25 nm) or equal to, but is not limited thereto.

The channel layer 240 may include a semiconductor material. The channel layer 240 may include, for example, polycrystalline silicon (poly-Si). The second layer 22 contacting the channel layer 240 may include a silicon oxide. The second layer 22 may be a native oxide layer resulted from the poly-Si.

A source electrode S and a drain electrode D may be connected to both ends of the channel layer 240, respectively.

The gate insulating layer 250 may include various types of insulating materials. For example, silicon oxide, silicon nitride, or silicon oxynitride may be included in the gate insulating layer 250.

A voltage for turning on/off the channel layer 240 may be selectively applied to each of the plurality of gate electrodes 260.

The illustrated variable resistance memory device 200 may have a structure in which a plurality of memory cells MC are arrayed, wherein each of the memory cells MC may have a form in which a transistor and a variable resistance are connected in parallel as shown in the equivalent circuit of FIG. 2. Each variable resistance may be set according to a voltage applied to the gate electrode 260 and a voltage between the source electrode S and the drain electrode D. Each variable resistor may have a value corresponding to data of 1 or 0.

An operation of the variable resistance memory device 200 is described below with reference to FIG. 3.

When a memory cell on which a program operation is to be performed is selected, a gate voltage value of the selected cell may be adjusted such that a channel may not be formed in the selected cell, that is, such that the selected cell is in a channel-off state, and a gate voltage value of non-selected cells may be adjusted such that the non-selected cells are in a channel-on state.

FIG. 3 illustrates a case in which a gate voltage is applied to the gate electrode 260 of each of cells MC1, MC2, and MC3 such that a middle memory cell MC2 becomes off, and two memory cells MC1 and MC3 at both sides become on. When a voltage is applied between the source electrode S and the drain electrode D, a conductive path indicated by arrow A may be formed. By configuring an applied voltage to have a value of the set voltage Vset or the reset voltage Vreset, desired data (e.g., 1 or 0) may be written in the selected memory cell MC2.

In a read operation, the read operation may be performed on a selected cell in a similar way to the way described above. That is, after adjusting the gate voltage applied to each gate electrode 260 such that the selected memory cell MC2 is in a channel-off state and the non-selected memory cells MC1 and MC3 are in a channel-on state, a current flowing through the corresponding cell MC2 may be measured via an applied voltage $V_{read}$ between the source electrode S and the drain electrode D, in order to determine a cell state (e.g., 1 or 0).

Referring to FIG. 3, the conductive path indicated by arrow A may not form and/or may be limited in the capping layer 220 in the selected memory cell MC2 because the capping layer 220 may have no oxygen vacancy (or may have relatively little oxygen vacancy) and thus the capping layer 220 may function as an insulator. Accordingly, leakage current to the capping layer 220 may be limited and/or prevented.

Figure 4:
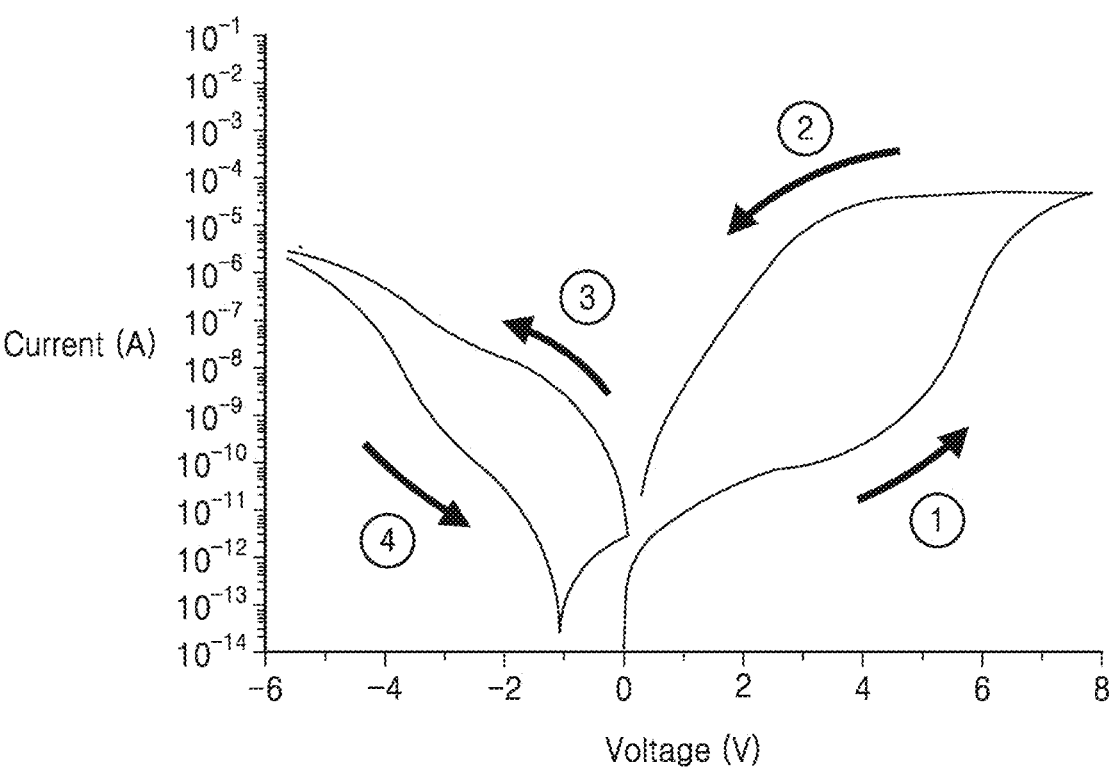
FIG. 4 is a conceptual graph of an I-V curve indicated by a variable resistance layer.
Figure 5:
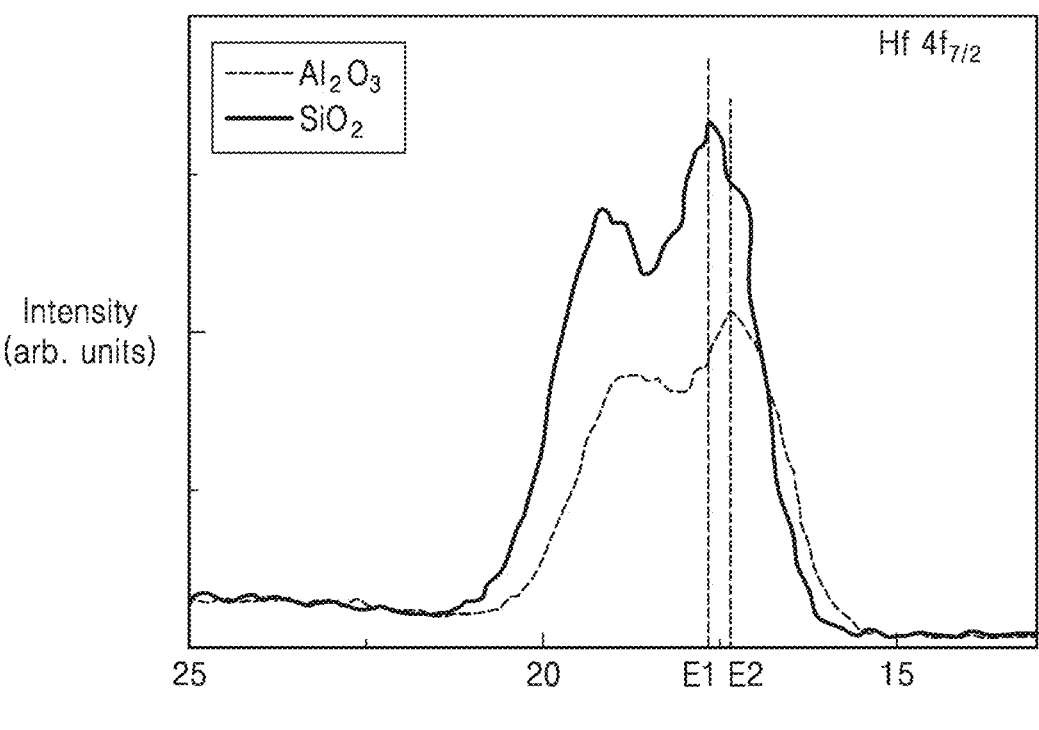
FIG. 5 is a graph of XPS analysis results for two samples in which different materials are included in a variable resistance layer and a capping layer.

FIG. 4 is a conceptual graph of an I-V curve indicated by a variable resistance memory device, and FIG. 5 is a graph showing XPS analysis results for two types of samples in which different materials are included in a variable resistance layer and a capping layer.

Operation ① corresponds to a process in which a voltage is increased from 0V to 6V to change a resistive state of a variable resistance material from a high resistive state (HRS) to a low resistive state (LRS). Operation ② corresponds to a process in which the voltage is decreased to 0V. In operation ③, when the voltage is changed from 0V to −6V, the resistive state of the variable resistance material is changed from the LRS to the HRS. Next, by performing operation ④, in which the voltage is changed from −6V to 0V, a cycle may be completed.

To identify a resistance change phenomenon, a resistance of the variable resistance material may be read at a voltage of 4V. Here, by measuring a ratio between a resistance value at the voltage of 4V in operation ① corresponding to the HRS state and a resistance value at the voltage of 4V in operation ② corresponding to the LRS state, the performance of the variable resistance layer may be determined.

Results of measuring the I-V curve as shown in FIG. 4 with respect to the variable resistance device samples including the capping layer and the variable resistance layer are shown in Table 1 below.

TABLE 1

| Switching characteristics of examples with variable resistance layer and capping layer. | | |
|---|---|---|
| Variable resistance layer (oxide formation energy) | Capping layer (oxide formation energy) | Switching yield |
| $HfO_2$ (−1000 kJ/mol) | $Al_2O_3$ (−1060 kJ/mol) | 11.1% |
| | $SiO_2$ (−845 kJ/mol) | 2.8% |
| $Ta_2O_5$ (−795 kJ/mol) | $Al_2O_3$ (−1060 kJ/mol) | 44% |
| | $HfO_2$ (−1000 kJ/mol) | 47% |

As a result of measuring the I-V curve with respect to the samples in which $HfO_2$ and $Al_2O_3$ are applied to the variable resistance layer and the capping layer, respectively, and the samples in which $HfO_2$ and $SiO_2$ are applied to the variable resistance layer and the capping layer, respectively, the switching yield rates are shown as 11.1% and 2.8%, respectively. Here, the switching yield rate denotes a rate of the number of samples in which a ratio between the resistance value at the voltage of 4V in operation ① corresponding to the HRS state and the resistance value at the voltage of 4V in operation ② corresponding to the LRS state in the I-V curve as shown in FIG. 4, is equal to or greater than 1000.

The switching yield rate of the samples in which the capping layer includes $Al_2O_3$, which has a lower oxide formation energy than $HfO_2$, is shown to be higher than that of the samples in which the capping layer includes $SiO_2$, which has a higher oxide formation energy than $HfO_2$.

The XPS graph of FIG. 5 shows Hf 4f peaks. Here, a binding energy at the peak location is E1, when the capping layer includes $SiO_2$, and a binding energy at the peak location is E2 that is slightly lower than E1 when the capping layer includes $Al_2O_3$. A higher binding energy indicates a lower oxygen vacancy. In other words, a lower binding energy may indicate a greater oxygen vacancy, and thus, may be understood to be advantageous for the variable resistance performance. The higher switching yield rate of the samples, which show the lower binding energy, that is, of the samples in which the capping layer includes $Al_2O_3$, may be analyzed to be based on a less oxide formation energy (a greater absolute value) of the material used in the capping layer.

In other examples, in which the variable resistance layer is formed of $Ta_2O_5$ and the capping layer is formed of $Al_2O_3$ or $HfO_2$, respectively, the switching yield rates are shown in Table 1 as 44% and 47%, respectively.

Figure 6:
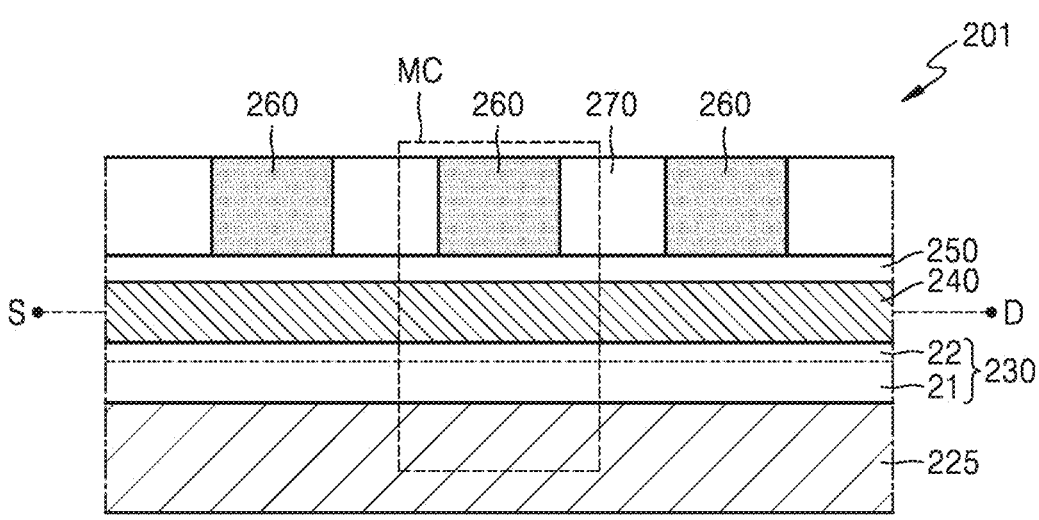
FIG. 6 is a cross-sectional view showing a schematic structure of a variable resistance memory device according to another embodiment.

FIG. 6 is a cross-sectional view showing a schematic structure of a variable resistance memory device 201 according to another embodiment.

The variable resistance memory device 201 may be different from the variable resistance memory device 200 of FIG. 1 in that in the variable resistance memory device 201, a support layer may include a material having a lower oxide formation energy than a variable resistance material of the variable resistance layer 230. That is, the support layer 225 may be understood to have the functions of both the support layer 210 and the capping layer 220 of the variable resistance memory device 200 of FIG. 1, and the example materials included in the capping layer 220 may be used for the support layer 225. The variable resistance layer 230 may be directly on the capping layer 225.

Figure 7A:
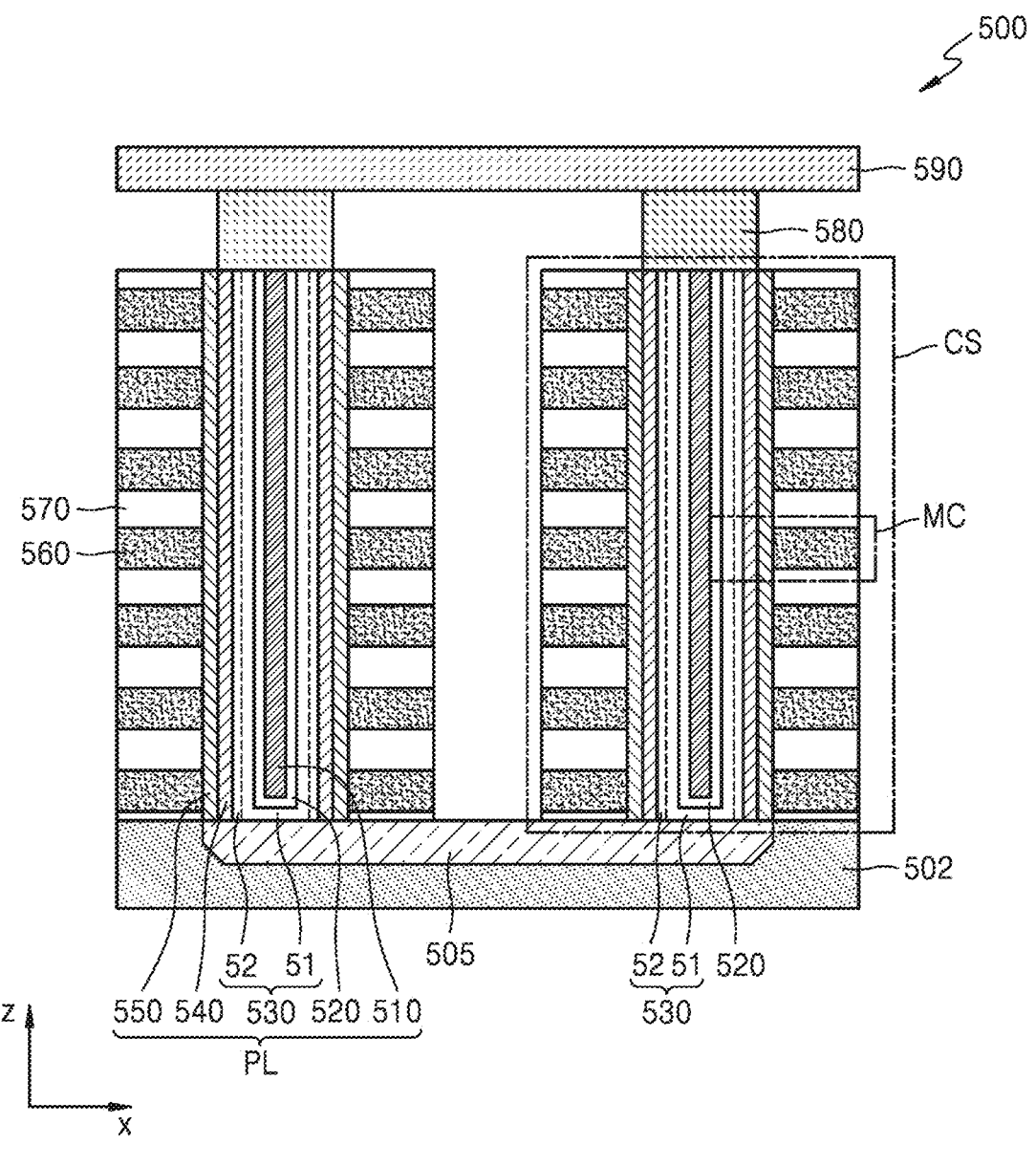
FIGS. 7A, and 7B are cross-sectional views showing schematic structures of variable resistance memory devices according to some embodiments.
Figure 7B:
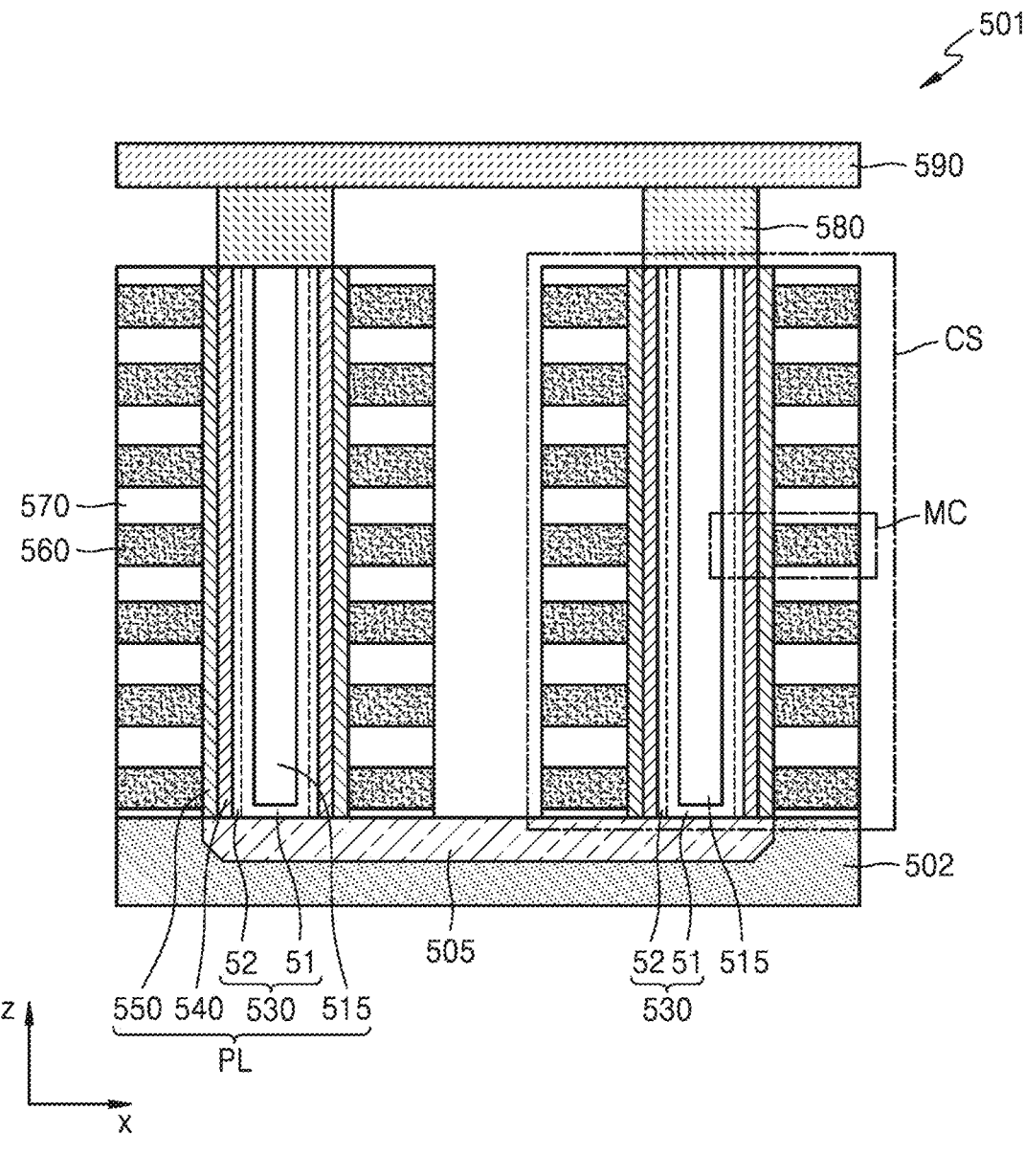
Figure 8A:
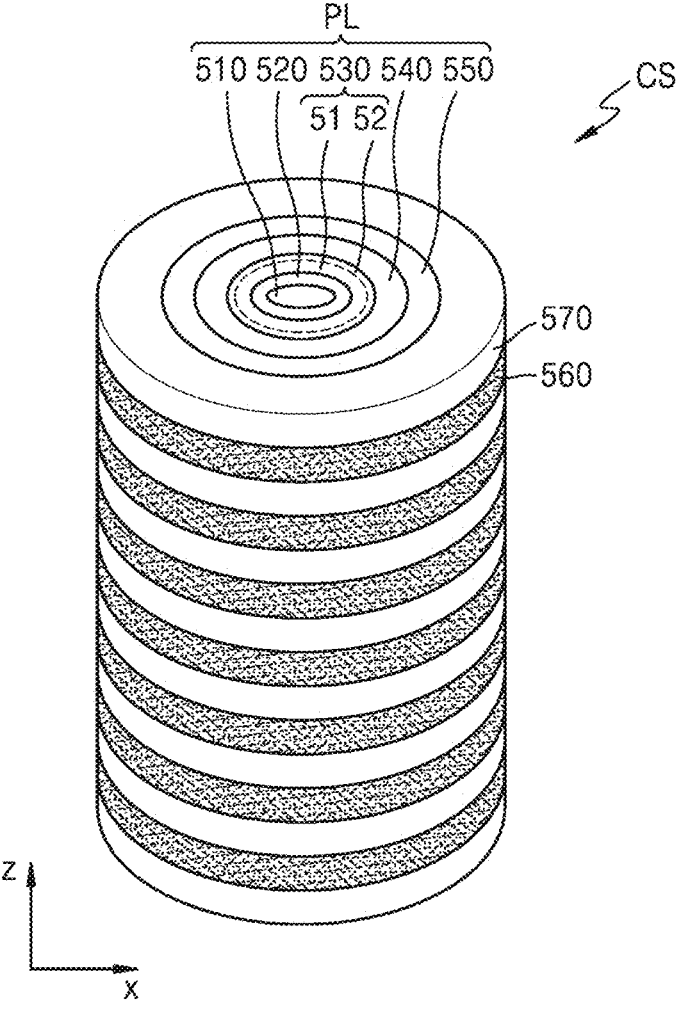
FIGS. 8A and 8B are perspective views showing schematic structures of cell strings included in the variable resistance memory devices of FIGS. 7A and 7B.
Figure 8B:
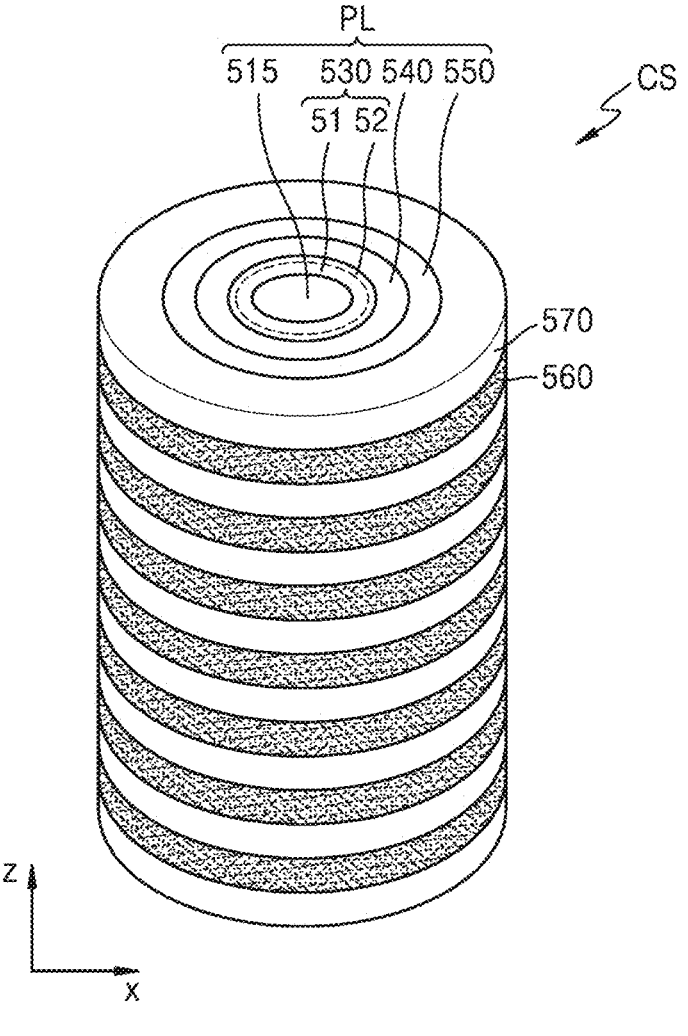
Figure 9:
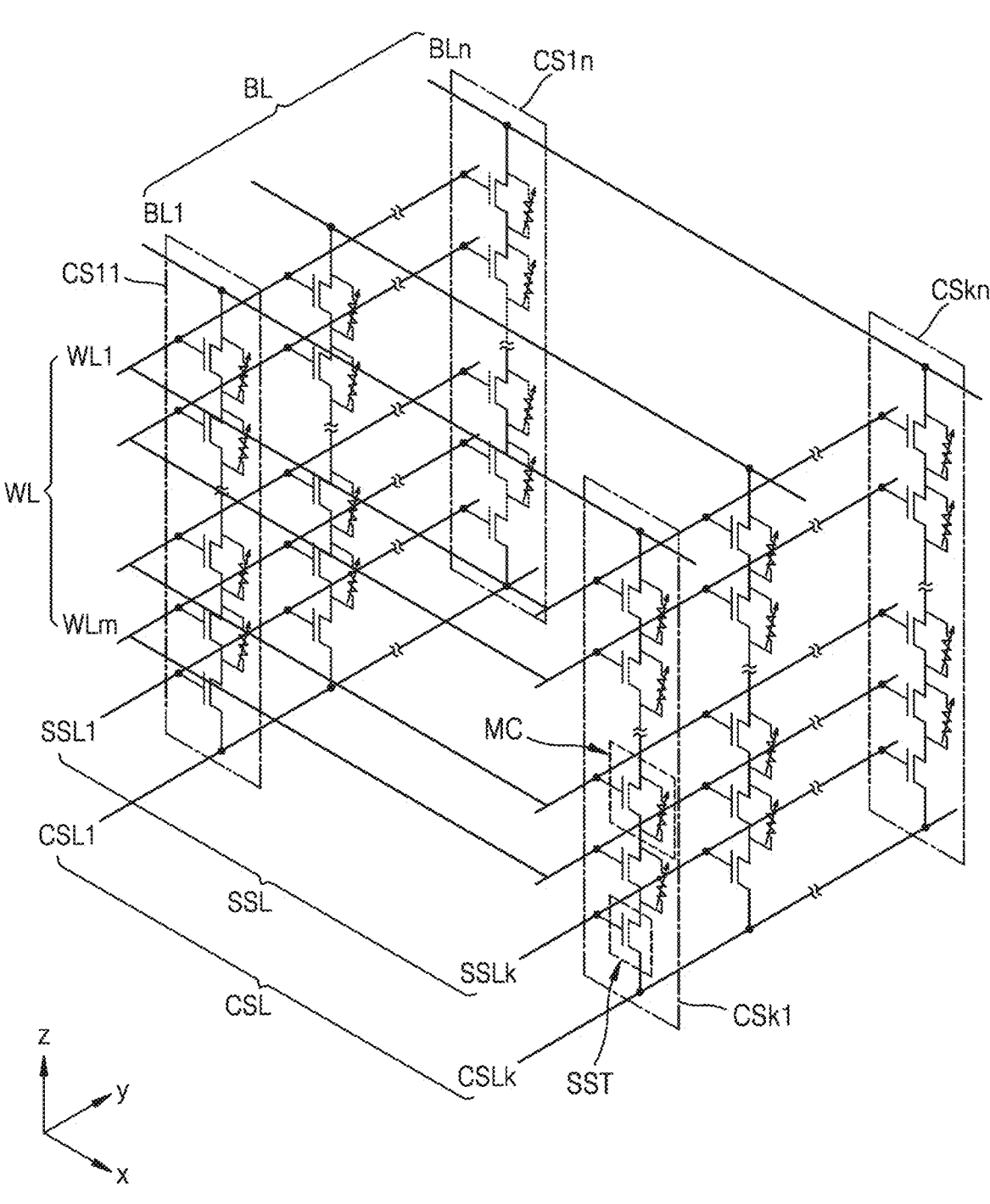
FIG. 9 is an equivalent circuit diagram of the variable resistance memory devices of FIGS. 7A and 7B.

FIGS. 7A and 7B are cross-sectional views showing schematic structures of variable resistance memory devices according to some embodiments. FIGS. 8A and 8B are perspective views showing schematic structures of cell strings included in the variable resistance memory devices of FIGS. 7A and 7B. FIG. 9 is an equivalent circuit diagram of the variable resistance memory devices of FIGS. 7A and 7B.

Referring to FIGS. 7A and 7B, variable resistance memory devices 500 and 501, according to the presented embodiments may correspond to a vertical NAND (VNAND) memory in which a plurality of memory cells MC including a variable resistance material are vertically arrayed.

Detailed configurations of the variable resistance memory devices 500 and 501 will be described below with reference to FIGS. 7A through 9 together.

First, referring to FIG. 7A, a plurality of cell strings CS may be formed on a substrate 502.

The substrate 502 may include a silicon material doped with a first-type impurity. For example, the substrate 502 may include a silicon material doped with a p-type impurity. For example, the substrate 502 may include a p-type well (for example, a pocket p well). Hereinafter, an example is described where the substrate 520 includes p-type silicon. However, the substrate 502 is not limited to p-type silicon.

A doped area 505, which is a source area, may be provided on the substrate 502. The doped area 505 may include an n-type area, which is different from the substrate 502. Hereinafter, it is assumed that the doped area 505 includes an n-type area. However, the doped area 505 is not limited to the n-type area. The doped area 505 may be connected to a common source line CSL.

K*n cell strings CS may be provided as indicated in the circuit diagram of FIG. 9 and may be arranged in the matrix form. The cell strings CS may be referred to as CSij (1≤i≤k, 1≤j≤n) according to a location of a column and a row. Each cell string CSij may be connected to a bit line BL, a string selection line SSL, a word line WL, and the common source line CSL.

Each cell string CSij may include the memory cells MC and a string selection transistor SST. The memory cells MC and the string selection transistor SST of each cell string CSij may be stacked in a height direction.

Rows of the plurality of cell strings CS may be connected to different string selection lines SSL1 through SSLk, respectively. For example, the string selection transistors SST of the cell strings CS11 through CS1n may be commonly connected to the string selection line SSL1. The string selection transistors SST of the cell strings CSk1 through CSkn may be commonly connected to the string selection line SSLk.

Columns of the plurality of cell strings CS may be connected to different bit lines BL1 through BLn, respectively. For example, the memory cells and the string selection transistors SST of the cell strings CS11 through CSk1 may be commonly connected to the bit line BL1, and the memory cells MC and the string selection transistors SST of the cell strings CS1n through CSkn may be commonly connected to the bit line BLn.

Rows of the plurality of cell strings CS may be connected to different common source lines CSL1 through CSLk, respectively. For example, the string selection transistors SST of the cell strings CS11 through CS1n may be commonly connected to the common source line CSL1, and the string selection transistors SST of the cell strings CSk1 through CSkn may be commonly connected to the common source line CSLk.

Gate electrodes of the memory cells MC located in the same height from the substrate 502 or the string selection transistors SST may be commonly connected to one word line WL. Also, gate electrodes of the memory cells MC located in different heights from the substrate 520 or the string selection transistors SST may be connected to different word lines WL1 through WLm, respectively.

The illustrated circuit structure is an example. For example, the number of rows of the cell strings CS may increase or decrease. When the number of rows of the cell strings CS is changed, the number of string selection lines connected to the rows of the cell strings CS and the number of cell strings CS connected to one bit line may also be changed. When the number of rows of the cell strings CS is changed, the number of common source lines connected to the rows of the cell strings CS may also be changed.

The number of columns of the cell strings CS may also increase or decrease. When the number of columns of the cell strings CS is changed, the number of bit lines connected to the columns of the cell strings CS and the number of cell strings CS connected to one string selection line may also be changed.

Heights of the cell strings CS may also increase or decrease. For example, the number of memory cells MC stacked in each of the cell strings CS may increase or decrease. When the number of memory cells MC stacked in each cell string CS is changed, the number of word lines WL may also be changed. For example, the number of string selection transistors included in each cell string CS may increase. When the number of string selection transistors included in each cell string CS is changed, the number of string selection lines or the common source lines may also be changed. When the number of string selection transistors increases, the string selection transistors may be stacked in the same form as the memory cells MC.

For example, a write operation and a read operation may be performed for each row of the cell strings CS. The cell strings CS may be selected for each row by the common source line CSL, and the cell strings CS may be selected for each row by the string selection lines SSL. Also, a voltage may be applied to the common source lines CSL by a unit of at least two common source lines. A voltage may be applied to the common source lines CSL by a unit of the entire common source lines CSL.

The write operation and the read operation may be performed for each page in a selected row of the cell strings CS. A page may correspond to one row of the memory cells connected to one word line WL. The memory cells may be selected for each page by the word lines WLs, in a selected row of the cell strings CSs.

As illustrated in FIG. 8A, the cell string CS may include a cylindrical pillar PL, a plurality of gate electrodes 560 and a plurality of insulators 570 that surround the cylindrical pillar PL as a ring shape. The plurality of insulators 570 may be configured to isolate between the plurality of gate electrodes 560. The plurality of gate electrodes 560 and the plurality of insulators 570 may be alternately stacked in a vertical direction (a z direction).

The gate electrodes 560 may include a metal material, or a silicon material doped in a high concentration. Each gate electrode 560 may be connected to either of a word line WL and a string selection line SSL.

The insulators 570 may include various insulating materials, such as silicon oxide, silicon nitride, or the like.

The pillar PL may include a plurality of layers. The cylindrical pillar PL may include a cylinder-shaped support layer 510 extending in the vertical direction, and a capping layer 520, a variable resistance layer 530, a channel layer 540, and a gate insulating layer 550, which sequentially surround the support layer 510 as a shell shape.

The outermost layer of the pillar PL may be the gate insulating layer 550. For example, the gate insulating layer 550 may include various insulating materials, such as silicon oxide, silicon nitride, silicon oxynitride, or the like. The gate insulating layer 550 may be conformally deposited on the pillar PL.

The channel layer 540 may be conformally deposited along an inner surface of the gate insulating layer 550. The channel layer 540 may include a semiconductor material doped with a first-type material. The channel layer 540 may include a silicon material doped with a material of the same-type as the substrate 502. For example, when the substrate 502 includes a p-type doped silicon material, the channel layer 540 may also include a p-type doped silicon material. Alternatively, the channel layer 540 may include materials, such as Ge, IGZO, GaAs, etc.

The variable resistance layer 530 may be arranged along an inner surface of the channel layer 540. The variable resistance layer 530 may be arranged to contact the channel layer 540 and may be conformally deposited on the channel layer 540.

The variable resistance layer 530 refers to a layer that is changed to a high resistive state or a low resistive state according to an applied voltage. Materials and the characteristics of the variable resistance layer 530 may be substantially the same as the variable resistance layer 230 described above. The variable resistance layer 530 may include a plurality of layers including a first layer 51 and a second layer 52.

The capping layer 520 may be formed along an inner surface of the variable resistance layer 530. The capping layer 520 may be conformally deposited on the variable resistance layer 530. As described above according to the embodiment described above, the capping layer 520 may include a material that effectively maintains oxygen vacancies formed in the variable resistance layer 530. The capping layer 520 may include a material having a lower oxide formation energy than a variable resistance material of the variable resistance layer 530. When the variable resistance layer 530 includes the plurality of layers including the first layer 51 and the second layer 52, the capping layer 520 may include a material having a lower oxide formation energy than a material of the first layer 51 contacting the capping layer 520.

By including this capping layer 520, a difference between a resistance value in a high resistive state and a resistance value in a low resistive state may be increased in the variable resistance memory device 500, and the variable resistance memory device 500 may have the characteristics of low set and reset voltages. In some embodiments, the variable resistance layer 530 may be directly on the capping layer 520.

The support layer 510 may be formed by depositing an insulating material along an inner surface of the variable resistance layer 530. The support layer 510 may be formed to have a cylindrical shape filling the innermost space of the pillar PL.

According to a modified embodiment, the support layer 510 and the capping layer 520 may include the same material. In other words, all portions of the pillar PL along the inner surface of the variable resistance layer 530 may be filled with a material having a lower oxide formation energy (higher absolute value) than the variable resistance material of the variable resistance layer 530. For example, as depicted in FIGS. 7B and 8B, a variable resistance memory device 501 may be the same as the variable resistance memory device 500 in FIG. 7A except the cell string CS may include a single capping layer 515 instead of the capping layer 520 and support layer 510 illustrated in FIG. 7A. The capping layer 515 in FIG. 7B may be formed of the same material as the capping layers 220 and 520 discussed above in FIGS. 1 and 7A.

The channel layer 540 and the variable resistance layer 530 may contact the doped area 505 and the doped area 505 may be a common source area. The doped area 505 may be referred to as a source structure.

A drain area 580 may be provided on the pillar PL of the cell string CS. The drain area 580 may include a second-type doped silicon material. For example, the drain area 580 may include a silicon material doped with an n-type material. The drain area 580 may be referred to as a drain contact or drain structure.

A bit line 590 may be provided on the drain area 580. The drain area 580 and the bit line 590 may be connected to each other via contact plugs.

Each gate electrode 560, and regions of the gate insulating layer 550, the channel layer 540, and the variable resistance layer 530 facing the gate electrode 560 in a horizontal direction (an x direction) may form a memory cell MC. That is, the memory cell MC may have a circuit structure in which a transistor including the gate electrode 560, the gate insulating layer 550, and the channel layer 540 is connected in parallel with a variable resistance due to the variable resistance layer 530.

The parallel connection structure may be continually arranged in the vertical direction (the z direction) to form the cell string CS. Also, both ends of the cell string CS may be connected to the common source line CSL and the bit line BL as illustrated in the circuit diagram of FIG. 9. By applying a voltage to the common source line CSL and the bit line BL, programming, reading, and erasing may be performed on a plurality of memory cells MC.

For example, when a memory cell MC on which a program operation is to be performed is selected, a gate voltage value of the selected cell may be adjusted such that the selected cell is in a channel-off state, and a gate voltage value of non-selected cells may be adjusted such that the non-selected cells are in a channel-on state. Accordingly, a current path due to the voltage applied to the common source line CSL and the bit line BL may pass through an area of the variable resistance layer 530 of the selected memory cell MC. Here, the applied voltage may be set as $V_{set}$ or $V_{reset}$ to form a low resistive state or a high resistive state and to write data (e.g., 1 or 0) in the selected memory cell MC as desired.

With respect to a read operation, reading may be performed on a selected cell according to a similar method. That is, a gate voltage applied to each gate electrode 560 may be adjusted such that a selected memory cell MC is in a channel-off state and non-selected memory cells MC are in a channel-on state. Then, a current flowing through the corresponding cell MC due to an applied voltage $V_{read}$ between the common source line CSL and the bit line BL may be measured to identify a cell state (e.g., 1 or 0).

In this VNAND structure, it is known that there is a limit to increase the number of gate electrodes 560 included in the cell string CS, due to a packaging limit according to a height of the cell string CS. Moreover, in the case of a charge-trap based memory device, there is a limit to reduce a distance between adjacent gate electrodes 560 due to interference. For example, it is known that it may be difficult to reduce a sum of vertical lengths of the gate electrode 560 and the insulator 570 adjacent to each other in the vertical direction (the z direction) to a value that is equal to or less than about 38 nm, and thus, there is a limit in a memory capacity.

According to the variable resistance memory device 500 according to an embodiment, the memory device may be realized by arraying the memory cells MC that include the capping layer 520 for easily maintaining oxygen vacancies is formed on the variable resistance layer 530. Thus, compared to a previous structure, for example, a phase-change material based-memory device or a charge trap based-memory device, the variable resistance layer 530 of the variable resistance memory device 500 may be formed to have a less thickness, and the variable resistance memory device 500 may have a lower operation voltage. Also, accordingly, it is may be advantageous for reducing the sum of the vertical (the z direction) lengths of the gate electrode 560 and the insulator 570 adjacent to each other. Based on this structure, the variable resistance memory device 500 may address a scaling issue between the memory cells in next-generation VNAND memories, to increase the density and realize low power consumption.

The variable resistance memory devices 200, 201, and 500 according to the disclosure may be implemented as memory systems of various electronic devices. The variable resistance memory device 500 may be realized as a memory block in the form of a chip and may be used as a neuromorphic computing platform or may be used to form a neural network.

Figure 10:
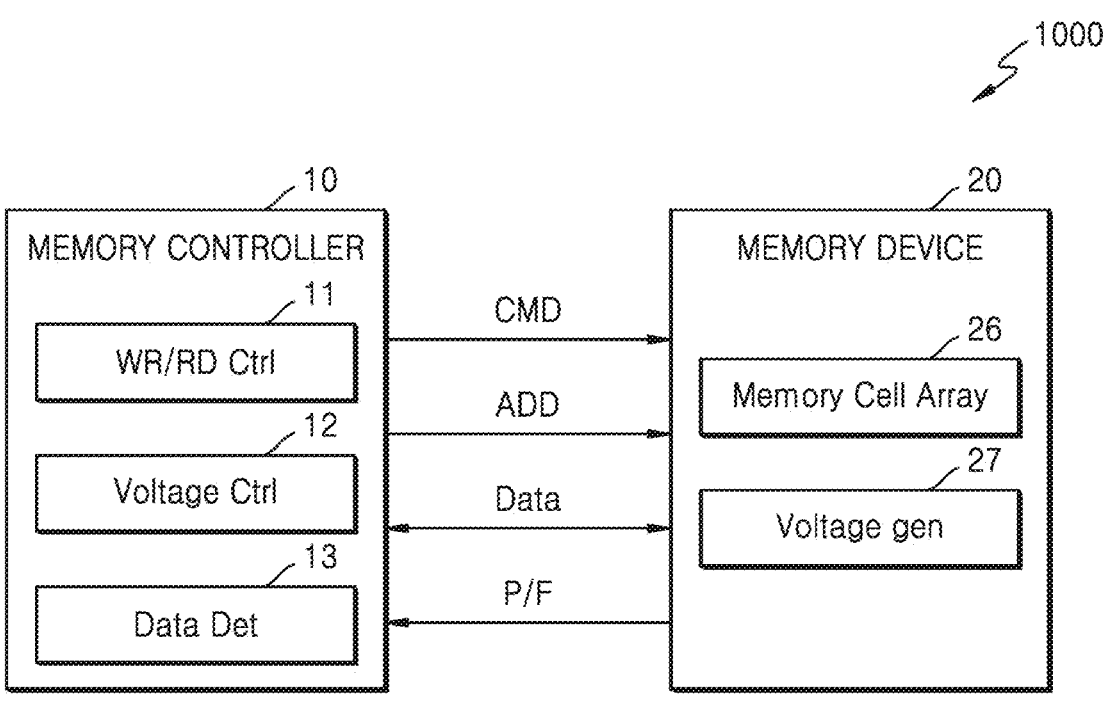
FIG. 10 is a block diagram of a memory system according to an embodiment.

FIG. 10 is a block diagram of a memory system 1000 according to an embodiment. Referring to FIG. 10, the memory system 1000 may include a memory controller 10 and a memory device 20. The memory controller 10 may perform a control operation with respect to the memory device 20. For example, the memory controller 10 may provide an address ADD and a command CMD to the memory device 20 to perform a program (or write) operation, a read operation, and an erase operation on the memory device 20. Also, data for the program operation and data that is read may be exchanged between the memory controller 10 and the memory device 20.

The memory device 20 may include a memory cell array 26 and a voltage generator 27. The memory cell array 26 may include a plurality of memory cells arranged in areas in which a plurality of word lines and a plurality of bit lines cross each other. The memory cell array 26 may include flash memory cells realized as various shapes by including nonvolatile memory cells for storing data in a nonvolatile way. The memory cell array 26 may include the variable resistance memory devices 200, 201, 500 and 501 according to the embodiments of FIGS. 1, 6, 7A, and 7B. For example, the memory cell array 26 may include three-dimensional (or vertical) NAND memory cells.

The memory controller 10 may include a program/read controller 11, a voltage controller 12, and a data determiner 13.

The program/read controller 11 may generate an address ADD and a command CMD for performing program/read/erase operations on the memory cell array 26. Also, the voltage controller 12 may generate a voltage control signal for controlling at least one voltage level used in the nonvolatile memory device 20. For example, the voltage generator 12 may generate a voltage control signal for controlling a voltage level of a word line for reading data from the memory cell array 26 or programming data to the memory cell array 26.

The data determiner 13 may perform a determination operation with respect to the data read from the memory device 20. For example, by determining data read from the memory cells, the number of on cells and/or off cells from among the memory cells may be determined. The memory device 20 may provide a pass/fail (P/F) signal to the memory controller 10 according to a result of the determination respect to the read data. The data determiner 13 may control a write operation and a read operation on the memory cell array 26 by referring to the P/F signal. As an example of an operation, when a program operation is performed on the plurality of memory cells, states of data of the memory cells may be determined by using a predetermined read voltage, to determine whether or not the program operation is successfully completed with respect to all of the cells.

Figure 11:
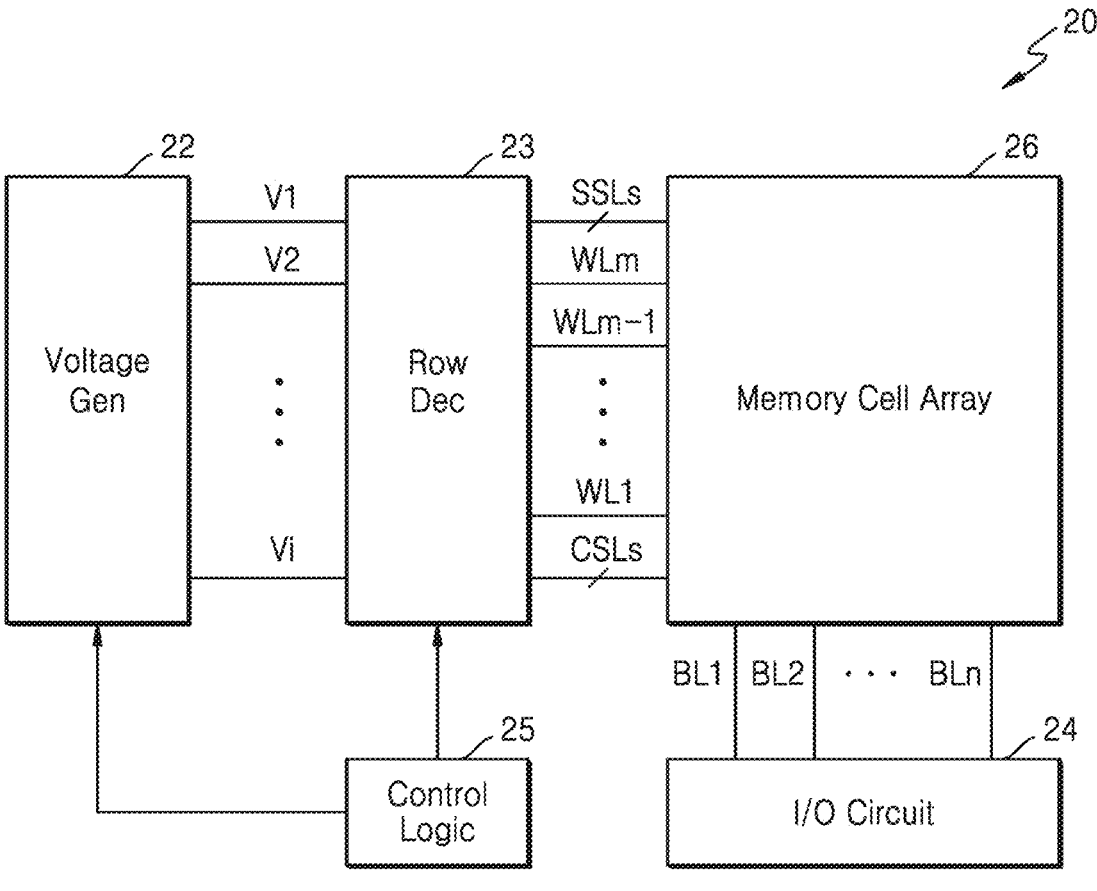
FIG. 11 is a block diagram of a memory device included in the memory system of FIG. 10, according to an embodiment.

FIG. 11 is a block diagram of the memory device 20 included in the memory system 1000 of FIG. 10, according to an embodiment. Referring to FIG. 11, the memory device 20 may further include a row decoder 23, an input and output circuit 24, and a control logic 25.

The memory cell array 26 may be connected to one or more string selection lines SSL, a plurality of word lines WL1 through WLm, one or more common source lines CSLs, and a plurality of bit lines BL1 through BLn. A voltage generator 27 may generate one or more word line voltages V1 through Vi, and the one or more word line voltages V1 through Vi may be provided to a row decoder 23. A signal for program/read/erase operations may be applied to the memory cell array 26 through the bit lines BL1 through BLn.

Also, data to be programmed may be provided to the memory cell array 26 through the input and output circuit 24, and data that is read may be provided to the outside (for example, a memory controller) through the input and output circuit 24. The control logic 25 may provide various control signals related to a memory operation to the row decoder 23 and the voltage generator 27.

According to a decoding operation of the row decoder 23, the word line voltages V1 through Vi may be provided to various lines SSLs, WL1 through WLm, and CSLs. For example, the word lines voltages V1 through Vi may include a string selection voltage, a word line voltage, and ground selection voltages. The string selection voltage may be provided to one or more string selection lines SSLs, the word line voltage may be provided to one or more word lines WL1 through WLm, and the ground selection voltage may be provided to one or more common source lines CSLs.

Figure 12:
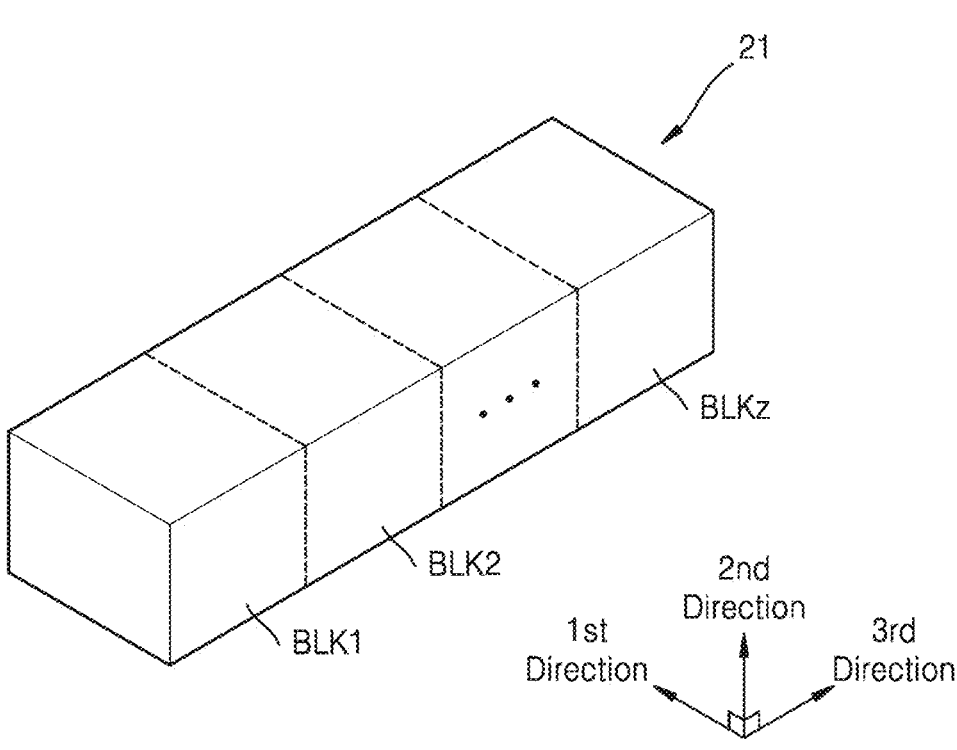
FIG. 12 is a block diagram of a memory cell array included in the memory system of FIG. 10.

FIG. 12 is a block diagram of the memory cell array 26 included in the memory system 1000 of FIG. 10. Referring to FIG. 12, the memory cell array 26 may include a plurality of memory blocks BLK1 through BLKz. Each memory block BLK may have a three-dimensional (or vertical) structure. For example, each memory block BLK may include structures extending in first through third directions. For example, each memory block BLK may include a plurality of memory cell strings extending in the second direction. Also, the plurality of memory cell strings may be two-dimensionally arranged in the first and third directions. Each memory cell string may be connected to the bit line BL, the string selection line SSL, the word lines WL, and the common source line CSL. Thus, each of the memory blocks BLK1 through BLKz may be connected to the plurality of bit lines BL, the plurality of string selection lines SSLs, the plurality of word lines WL, and the plurality of common source lines CSL. The memory blocks BLK1 through BLKz may be formed to have the equivalent circuit illustrated in FIG. 9.

Figure 13:
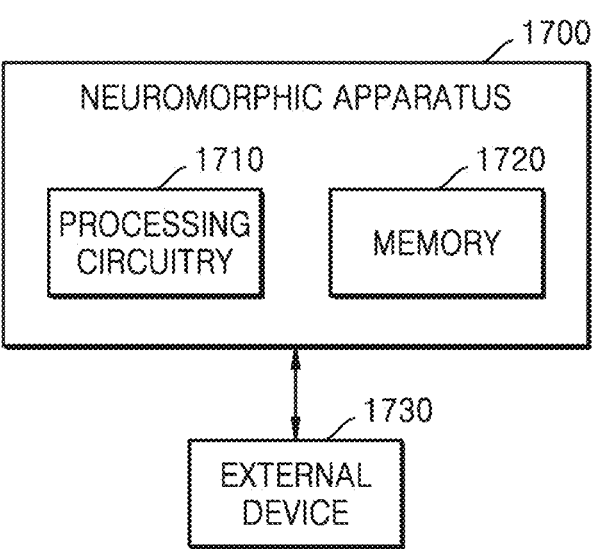
FIG. 13 is a block diagram of a neuromorphic apparatus and an external device connected thereto, according to an embodiment.

FIG. 13 is a block diagram of a neuromorphic apparatus 1700 and an external device connected thereto, according to an embodiment.

Referring to FIG. 13, the neuromorphic apparatus 1700 may include processing circuitry 1710 and/or an memory 1720. The neuromorphic apparatus 1700 may include the variable resistance memory devices 200, 201, and 500 according to the embodiments of FIGS. 1, 6, and 7.

In some embodiments, the processing circuitry 1710 may be configured to control functions of driving the neuromorphic apparatus 1700. For example, the processing circuitry 1710 may be configured to execute programs stored in the memory 1720 to control the neuromorphic apparatus 1700. In some embodiments, the processing circuitry 1710 may include hardware, such as a logic circuit, a hardware/software combination, such as a processor executing software, or a combination thereof. For example, the processor may include a CPU, a graphics processing unit (GPU), an application processor (AP) included in the neuromorphic apparatus 1700, an ALU, a digital signal processor, a microcomputer, a FPGA, an SoC, a programmable logic unit, a microprocessor, an ASIC, etc., but is not limited thereto. In some embodiments, the processing circuitry 1710 may be configured to read/write various data with respect to an external device 1730 and/or execute the neuromorphic apparatus 1700 by using the read/written data. In some embodiments, the external device 1730 may include an external memory having an image sensor (for example, a CMOS image sensor circuit) and/or a sensor array.

In some embodiments, the neuromorphic apparatus 1700 of FIG. 13 may be applied to a machine learning system. The machine learning system may include various artificial neural network organizations and processing models, such as a convolution neural network (CNN), a repeated neural network (RNN) selectively including a deconvolution neural network, a long short-term memory (LSTM) unit, and/or a gated recurrent unit (GRU), a stacked neural network (SNN), a state-space dynamic neural network (SSDNN), a deep faith network (DBN), a generative adversarial network (GAN), and/or a restricted Boltzmann machine (RBM).

Alternatively or additionally, the machine learning system may include: other types of machine learning models, for example, linear and/or logistic regression, statistics clustering, Bayesian classification, determination trees, dimensional reduction such as main component analyses, expert systems, and/or random forests; or a combination thereof. The machine learning models may be used to provide various services and/or applications. For example, an image classification service, a user authentication service based on biometric information or biometric data, an advanced driver assistance system (ADAS) service, a voice assistance service, an automatic speech recognition (ASR) service, etc. may be executed by an electronic device.

The variable resistance memory devices 200, 201, and 500 according to the embodiments are described above with reference to the drawings. However, they are only examples, and it would be understood by one of ordinary skill in the art that various modified and equivalent embodiments may be possible based the described examples. Various detailed configurations are described above. However, they should not limit the scope of the disclosure and should be interpreted as detailed examples of embodiments. Therefore, the scope of the disclosure should be defined by the technical concept described in the claims, rather than the embodiments described above.

In the variable resistance memory device described above, a resistance change may occur at a low applied voltage.

The variable resistance memory device described above may indicate a wide range of variable resistances.

The variable resistance memory device described above may be preferable for realizing low power consumption and high integration.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A variable resistance memory device comprising:
a support layer including an insulating material;
a variable resistance layer on the support layer and including a variable resistance material;
a capping layer between the support layer and the variable resistance layer, the capping layer being configured to protect the variable resistance layer;
a channel layer on the variable resistance layer;
a gate insulating layer on the channel layer; and
a plurality of gate electrodes and a plurality of insulators alternately and repeatedly arranged on the gate insulating layer in a first direction parallel with the channel layer, wherein
the variable resistance layer includes a silicon oxide layer contacting the channel layer and the variable resistance material on the silicon oxide layer.

2. The variable resistance memory device of claim 1, wherein the capping layer includes a material configured to maintain an amount of oxygen vacancies formed in the variable resistance layer.

3. The variable resistance memory device of claim 1, wherein
the capping layer includes a metal oxide that has an oxide formation energy having a greater absolute value than an absolute value of an oxide formation energy of the variable resistance material.

4. The variable resistance memory device of claim 1, wherein
the variable resistance layer has a structure including a plurality of layers, and
the capping layer includes an oxide that has an oxide formation energy having a greater absolute value than an absolute value of an oxide formation energy of a layer of the plurality of layers, and
the layer contacts the capping layer.

5. The variable resistance memory device of claim 1, wherein a thickness of the variable resistance layer is equal to or less than about 100 nm.

6. The variable resistance memory device of claim 5, wherein a thickness of the capping layer is equal to or greater than about 2 nm.

7. The variable resistance memory device of claim 1, wherein a thickness of the capping layer is equal to or less than about 100 nm.

8. The variable resistance memory device of claim 1, wherein
the variable resistance material is $Ta_2O_5$, and
the capping layer includes any one of $HfO_2$, $Al_2O_3$, $ZrO_2$, MgO, CaO, SrO, BaO, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

9. The variable resistance memory device of claim 1, wherein
the variable resistance material is $TiO_2$, and
the capping layer includes any one of $HfO_2$, $Al_2O_3$, $ZrO_2$, MgO, CaO, SrO, BaO, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

10. The variable resistance memory device of claim 1, wherein
the variable resistance material is $HfO_2$, and
the capping layer includes any one of $Al_2O_3$, MgO, CaO, SrO, BaO, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

11. The variable resistance memory device of claim 1, wherein
the variable resistance material is $ZrO_2$, and
the capping layer includes any one of MgO, CaO, SrO, BaO, $La_2O_3$, $Nd_2O_3$, $Eu_2O_3$, $CeO_2$, $Sm_2O_3$, $Gd_2O_3$, $Sc_2O_3$, $Lu_2O_3$, and $Y_2O_3$.

12. The variable resistance memory device of claim 1, wherein the channel layer includes a polycrystalline silicon (poly-Si) material.

13. The variable resistance memory device of claim 1, wherein the support layer and the capping layer include a same material.

14. The variable resistance memory device of claim 1, wherein
the support layer has a cylindrical shape and extends in the first direction,
the variable resistance layer, the channel layer, and the gate insulating layer surround the support layer in a cylindrical shell form, sequentially in an order of the variable resistance layer, the channel layer, and the gate insulating layer, and
the plurality of gate electrodes and the plurality of insulators alternately surround the gate insulating layer.

15. The variable resistance memory device of claim 14, wherein
the capping layer includes an oxide that has an oxide formation energy having a greater absolute value than an absolute value of an oxide formation energy of the variable resistance material.

16. The variable resistance memory device of claim 14, wherein
the variable resistance layer has a structure including a plurality of layers, and
the capping layer includes an oxide that has an oxide formation energy having a greater absolute value than an absolute value of an oxide formation energy of a layer of the plurality of layers in the variable resistance layer, and the layer contacts the capping layer.

17. The variable resistance memory device of claim 14, wherein the support layer and the capping layer include a same material.

18. The variable resistance memory device of claim 14, further comprising:

a drain structure and a source structure respectively contacting both ends of the channel layer and the variable resistance layer in the first direction;

a bit line connected to the drain structure;

a source line connected to the source structures; and a plurality of word lines respectively connected to the plurality of gate electrodes.

19. An electronic device comprising:

the variable resistance memory device of claim 1.

20. The variable resistance memory device of claim 1, wherein the variable resistance layer directly contacts the capping layer.

21. The variable resistance memory device of claim 1, wherein the variable resistance material is $HfO_2$, and the capping layer includes $Al_2O_3$.

22. The variable resistance memory device of claim 1, wherein the variable resistance material is $Ta_2O_5$, and the capping layer includes $Al_2O_3$.

23. The variable resistance memory device of claim 1, wherein the variable resistance material is $Ta_2O_5$, and the capping layer includes $HfO_2$.

* * * * *